(12) United States Patent
Shen et al.

(10) Patent No.: US 9,494,302 B2
(45) Date of Patent: Nov. 15, 2016

(54) HIGH-DEFINITION LED DISPLAY SCREEN AND SURFACE-MOUNTED LED COMPOSITE LAMP WITH ULTRA-SMALL POINT DISTANCE THEREOF

(71) Applicants: Yi Shen, Guangdong (CN); Jinming Bi, Guangdong (CN); Ling Liu, Guangdong (CN); Zhenzhi Wu, Guangdong (CN); Hanqu Wu, Guangdong (CN)

(72) Inventors: Yi Shen, Guangdong (CN); Jinming Bi, Guangdong (CN); Ling Liu, Guangdong (CN); Zhenzhi Wu, Guangdong (CN); Hanqu Wu, Guangdong (CN)

(73) Assignee: SHENZHEN AOTO ELECTRONICS CO., LTD, Shenzhen, Guangdong (CN)

( * ) Notice: Subject to any disclaimer, the term of this patent is extended or adjusted under 35 U.S.C. 154(b) by 255 days.

(21) Appl. No.: 14/382,346

(22) PCT Filed: Mar. 26, 2013

(86) PCT No.: PCT/CN2013/073191
§ 371 (c)(1),
(2) Date: Sep. 2, 2014

(87) PCT Pub. No.: WO2014/139189
PCT Pub. Date: Sep. 18, 2014

(65) Prior Publication Data
US 2015/0204525 A1    Jul. 23, 2015

(30) Foreign Application Priority Data
Mar. 11, 2013   (CN) .......................... 2013 1 0075976

(51) Int. Cl.
| | | |
|---|---|---|
| *F21V 21/00* | (2006.01) | |
| *F21V 19/00* | (2006.01) | |
| *H01L 33/62* | (2010.01) | |
| *H01L 25/075* | (2006.01) | |
| *H01L 33/48* | (2010.01) | |
| *F21K 99/00* | (2016.01) | |
| *H01L 27/15* | (2006.01) | |
| *H01L 33/36* | (2010.01) | |
| *H01L 23/00* | (2006.01) | |

(Continued)

(52) U.S. Cl.
CPC ............. *F21V 19/0025* (2013.01); *F21K 9/30* (2013.01); *H01L 24/97* (2013.01); *H01L 25/0753* (2013.01); *H01L 27/156* (2013.01); *H01L 33/36* (2013.01); *H01L 33/486* (2013.01); *H01L 33/62* (2013.01); *F21Y 2105/001* (2013.01); *F21Y 2113/005* (2013.01); *H01L 2924/0002* (2013.01)

(58) Field of Classification Search
CPC ..... H01L 24/97; H01L 25/01; H01L 27/156; H01L 33/486; H01L 33/52; F21V 19/0005; F21Y 2105/001; F21Y 2105/00
See application file for complete search history.

(56) References Cited

U.S. PATENT DOCUMENTS

| | | | |
|---|---|---|---|
| 2008/0180972 A1* | 7/2008 | Sakamoto .............. | G02B 6/009 362/613 |
| 2010/0085512 A1* | 4/2010 | Ueda ................. | G02F 1/133609 349/68 |
| 2016/0154170 A1* | 6/2016 | Thompson ........... | G02B 6/0073 362/609 |

*Primary Examiner* — Ali Alavi

(57) ABSTRACT

A high-definition LED display screen and a surface-mounted LED composite lamp with an ultra-small point distance thereof are provided. The high-definition LED display screen includes a plurality of the surface-mounted LED composite lamps with an ultra-small point distance. The surface-mounted LED composite lamp with an ultra-small point distance includes a lamp body, a plurality of pins arranged on a surface of one side of the lamp body, and a plurality of groups of LED pixel lamps arranged in an array on a surface of the other side of the lamp body, of which a periphery wrapped with transparent packages, each group of LED pixel lamps being electrically connected with the pins.

20 Claims, 5 Drawing Sheets

(51) Int. Cl.
*F21Y 105/00* (2016.01)
*F21Y 113/00* (2016.01)

HIGH-DEFINITION LED DISPLAY SCREEN AND SURFACE-MOUNTED LED COMPOSITE LAMP WITH ULTRA-SMALL POINT DISTANCE THEREOF

CROSS REFERENCE OF RELATED APPLICATION

This is a U.S. National Stage under 35 U.S.C 371 of the International Application PCT/CN2013/073191, filed Mar. 26, 2013, which claims priority under 35 U.S.C. 119(a-d) to CN 201310075976.0, filed Mar. 11, 2013.

BACKGROUND OF THE PRESENT INVENTION

1. Field of Invention

The present invention relates to the LED display technology, and particularly to a high-definition LED display screen and a surface-mounted LED composite lamp with an ultra-small point distance thereof.

2. Description of Related Arts

The LED display technology has been developing rapidly these years, and LED display screens have been widely used. As society develops, the demanded display quality is becoming higher and higher, requiring the LED display definition to get improved constantly which usually needs a higher pixel density, i.e. a smaller point distance between LED pixel lamps.

In the prior art, all the LED display screens of relatively high definition use a surface-mounted LED pixel lamp (SMD LED lamp) as showed in FIGS. 1 and 2 to achieve a relatively high definition, such as, with a small point distance of 3 mm. The surface-mounted LED pixel lamp comprises a lamp body 10, a group of LED pixel lamps 11 (usually including red, green and blue LED chips) provided on the upper surface of the lamp body 10, four pins 13 provided on the lower surface of the lamp body 10, and a shading fence 12 provided around the LED pixel lamps 11. We can see from FIGS. 1 and 2 that each surface-mounted LED pixel lamp has a very small size, and yet pins 13 are usually drawn from the side face of lamp body 10 to protrude from the bottom of lamp body 10, leaving less space on the side face of lamp body 10. For a higher definition, i.e. a smaller point distance, lamp body 10 is designed with a small size almost to the limit. The surface-mounted LED pixel lamp of such a small size is difficult to pack and mount, resulting in a low mounting precision and uncontrollable rejection rate. The small size of lamp body 10 is also responsible for a limited light emitting area leading to poor color mixing performance of the LED pixel lamp. Moreover, the clearances between lamp bodies 10 are too close to use veils as a regular way to improve contrast, and even with veils mounted, it is not easy to fix them firmly on the same plane, which means the surface planeness of the LED display screen cannot be ensured. In addition, since pins 13 are thin and numerous, their alignment and arrangement on the LED light board cost so much trouble that it's difficult to improve the brightness and refresh rate of the LED display screen. All these problems have seriously affected the display quality of the high-definition LED display screen and hampered its development and application. Therefore, the prior art requires betterment.

SUMMARY OF THE PRESENT INVENTION

A first object of the present invention is to provide an LED composite lamp with an ultra-small point distance aiming at those technical problems in the prior art, such as difficulty in mounting surface-mounted LED pixel lamps at a guaranteed yield rate, as well as unstable display quality of the finished high-definition LED display screen due to trouble in alignment for producing the light board.

The following technical solutions are provided for those problems:

A surface-mounted LED composite lamp with an ultra-small point distance comprises a lamp body, a plurality of pins arranged on a surface of one side of the lamp body, and a plurality of groups of LED pixel lamps arranged in an array on a surface of the other side of the lamp body, a periphery of the LED pixel lamps being wrapped with transparent packages, each group of the LED pixel lamps being electrically connected with the pins.

In a preferred technical solution, the LED pixel lamp comprises LED light emitting chips in red, green and blue, at least one for each of the three colors, anodes of each row of the LED light emitting chips in the same color being connected to one same pin and cathodes of each column of the LED light emitting chips in the same color being connected to one same pin.

In another more preferred technical solution, the LED pixel lamp comprises LED light emitting chips in red, green and blue, at least one for each of the three colors, anodes of each row of the red LED light emitting chips being connected to one same pin, anodes of each row of the green and blue LED light emitting chips being connected to one same pin, and cathodes of each column of the LED light emitting chips in the same color sharing one same pin.

In a preferred solution, a shading fence is provided around each group of the LED pixel lamps.

In a more preferred solution, criss-crossing grooves are formed between each shading fence.

In a preferred solution, a direction notch is provided at a corner of the surface of the one side of the lamp body arranged with the pins.

In a preferred solution, the surface-mounted LED composite lamp with an ultra-small point distance further comprises a direction notch provided at a corner of the surface of the one side of the lamp body arranged with the pins.

In a more preferred solution, the lamp body is square block shaped, and the pins are arranged on four edges of the surface of the one side of the lamp body.

In a further more preferred solution, the groups of LED pixel lamps total 16 and are arranged in a 4×4 array; and the pins total 20, 5 of which are arranged on each of the four edges of the surface of the one side of the lamp body.

In a preferred solution, at least two opposite sides of the lamp body are provided with intersecting projections.

In a preferred solution, a front face of the lamp body is, or both its front and side faces are, matte.

A second object of the present invention is to accordingly provide a high-definition LED display screen aiming at those technical problems in the prior art of using surface-mounted LED pixel lamps for a high-definition LED display screen, such as difficulty in mounting at a guaranteed yield rate, as well as unstable display quality of the finished high-definition LED display screen due to trouble in alignment for producing the light board.

The technical solution below is provided for those problems:

A high-definition LED display screen comprises a plurality of surface-mounted LED composite lamp with an ultra-small point distance of any kind of the aforesaid surface-mounted LED composite lamps with an ultra-small point distance.

The present invention has advantageous effects as below.

This modularized design, wherein the plurality of groups of the LED pixel lamps are arranged in the array on the surface of the one side of the lamp body and correspondingly the plurality of pins are arranged on the surface of the other side of the lamp body, will help a high-definition LED display screen having surface-mounted LED composite lamps with an ultra-small point distance that employ the technical solutions provided in the present invention to get a lamp body of a larger size, and moreover, each module comprises a plurality of groups of LED pixel lamps, thereby the mounting step getting easier and both of the mounting efficiency and the mounting yield rate getting elevated. Furthermore, a group of surface-mounted LED pixel lamps in the prior art has four pins whereas in the surface-mounted LED composite lamp with an ultra-small point distance of the invention the lamp body specifically uses an aluminum substrate allowing alignment to achieve a good cooling capacity and align within the lamp body by utilizing the features of dynamic scanning, where the leads of the LED light emitting chips of each group of the LED pixel lamps are grouped to get connected during the packing step and are eventually led to the outside of the lamp body via the pins, in which way the average number of pins corresponding to each group of LED pixel lamps is substantially reduced after sharing of the column pins. Reduction in the number of pins not only optimizes the structure of the lamp body by avoiding excessive thinness of the pins so as to reduce the mounting difficulty for a higher yield rate, but also avails to align on the LED light board to improve PCB routability and routing quality so as to lay a very good foundation for the LED display screen to accomplish a high refresh rate and high brightness. Besides, thanks to the step of grouping for connection, the number of pins is reduced and the space is enlarged so that the red lamps could use different pins from those for blue and green lamps to get power supply separately, which lowers power consumption and decreases heat. Also, the modularized design expands space for the lamp surface to enhance light emitting area and color mixing performance, and the production process is simplified as well because the lamp board no longer needs any veil mounted to increase contrast, which solves the problem in the prior art of poor veil planeness of high density products with a small point distance. In a word, comparing with the surface-mounted LED pixel lamp in the prior art, the surface-mounted LED composite lamp with an ultra-small point distance of the present invention could easily achieve an ultra-small point distance, which is usually less than 2 mm, as small as 1.2 or 1.0 mm or less. In contrast, the point distance of the traditional surface-mounted LED pixel lamp is hard to get to less than 2 mm, and although there is some traditional surface-mounted LED pixel lamp having a point distance of 1.5 mm, the finished product has unsatisfying display quality and is difficult to process. Using the LED composite lamp of the present invention for a LED display screen with an ultra-small point distance not only improves display quality of the high-definition LED display screen but also greatly reduces manufacturing difficulty and costs.

Here is a detailed description with reference to the drawings.

DETAILED DESCRIPTION OF THE PREFERRED EMBODIMENT

Embodiment One

Figure 1:
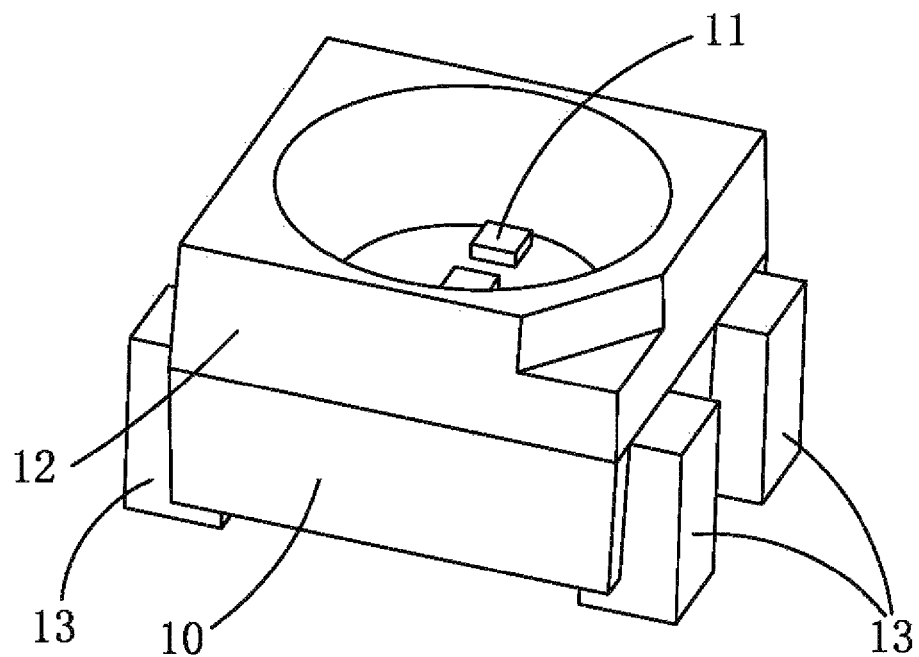
FIG. 1 is a first perspective view of a surface-mounted LED pixel lamp in the prior art.
Figure 2:
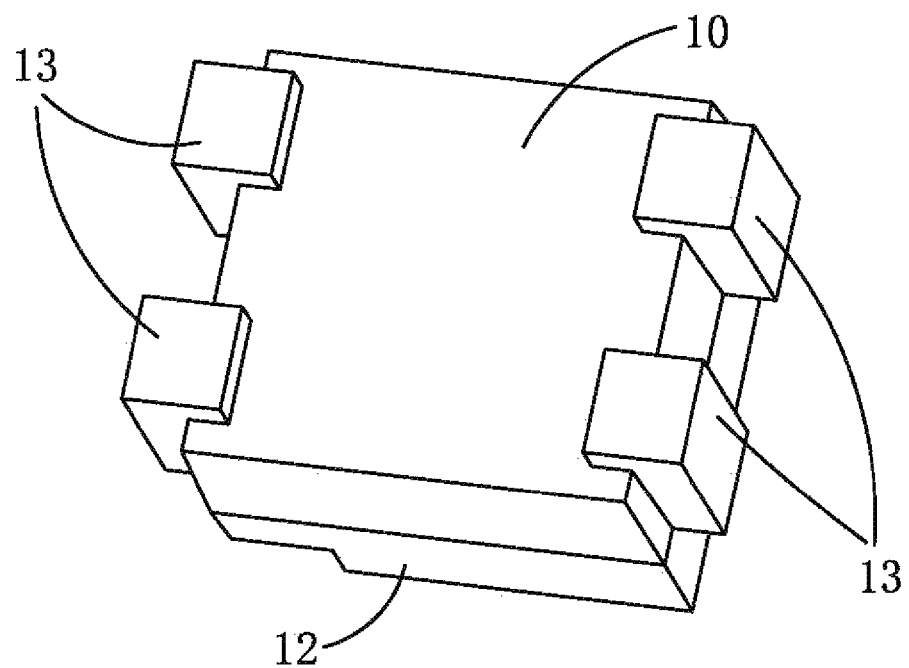
FIG. 2 is a second perspective view of the surface-mounted LED pixel lamp in the prior art.
Figure 3:
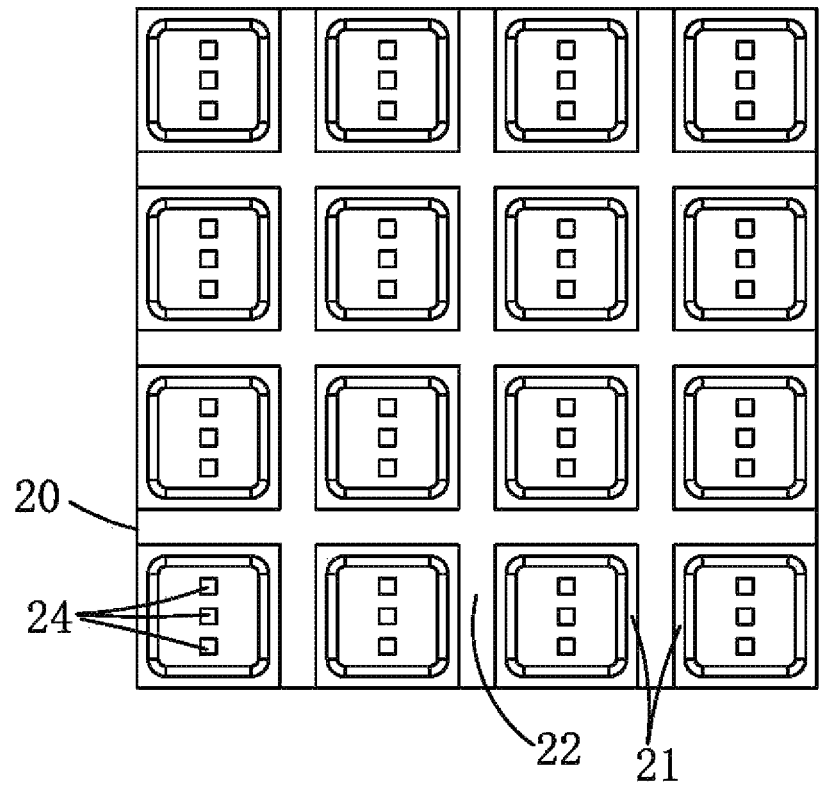
FIG. 3 is a main view of a surface-mounted LED composite lamp with an ultra-small point distance in Embodiment One of the present invention.
Figure 4:
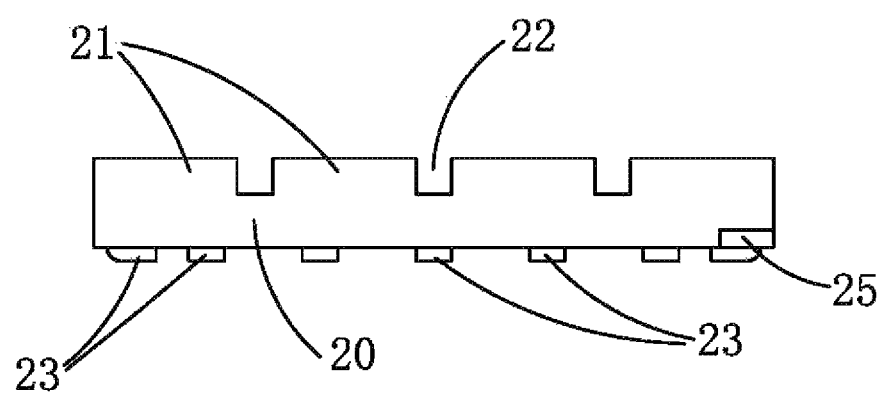
FIG. 4 is a bottom view of the surface-mounted LED composite lamp with an ultra-small point distance in the Embodiment One of the present invention.
Figure 5:
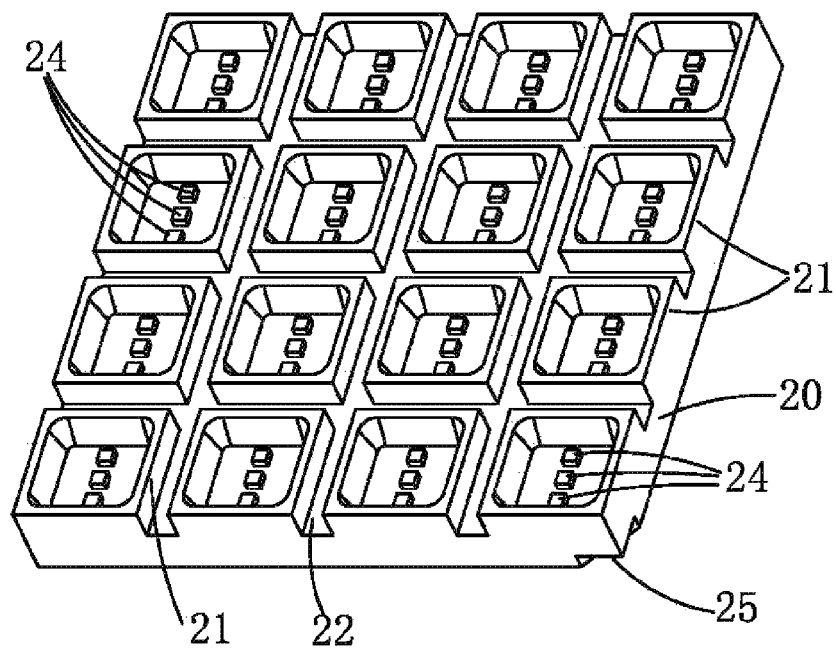
FIG. 5 is a first perspective view of the surface-mounted LED composite lamp with an ultra-small point distance in the Embodiment One of the present invention.
Figure 6:
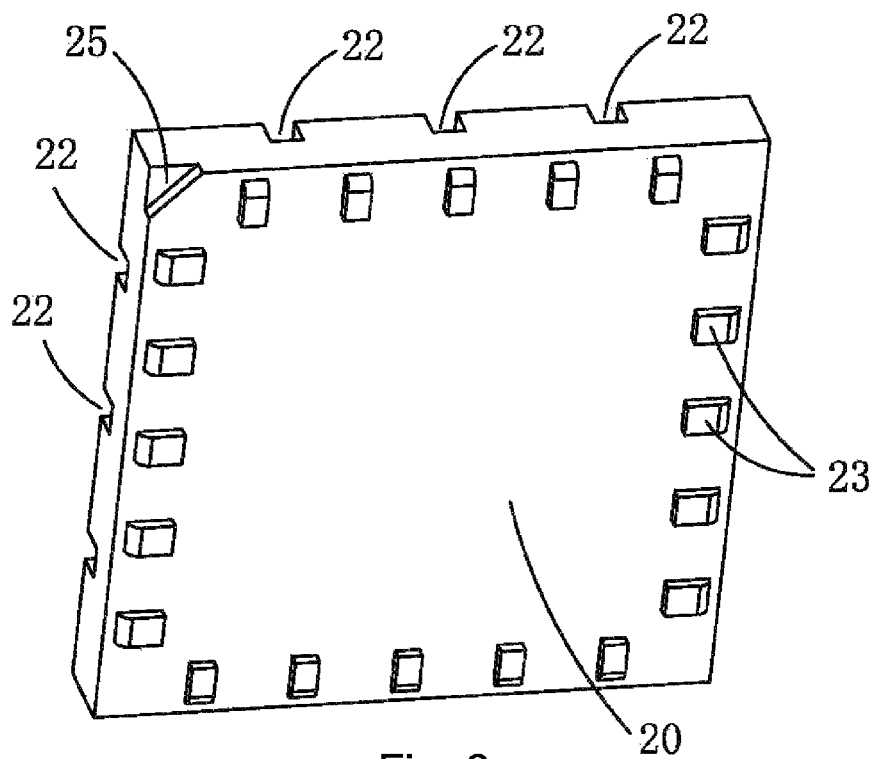
FIG. 6 is a second perspective view of the surface-mounted LED composite lamp with an ultra-small point distance in the Embodiment One of the present invention.
Figure 7:
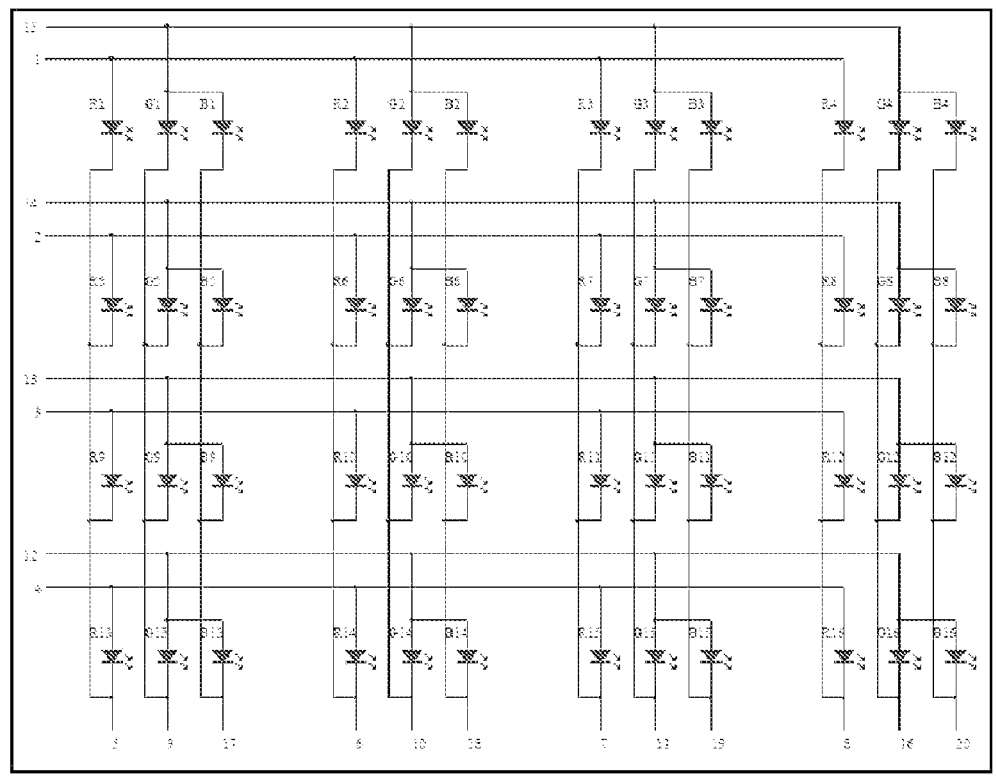
FIG. 7 is a wiring diagram of a circuit inside the surface-mounted LED composite lamp with an ultra-small point distance in the Embodiment One of the present invention.

The Embodiment One provides a high-definition LED display screen of which a light board is mounted with a surface-mounted LED composite lamp with an ultra-small point distance showed in FIGS. 3 to 6, other than a traditional surface-mounted LED pixel lamp. The surface-mounted LED composite lamp with an ultra-small point distance comprises a lamp body 20, a plurality of pins 23 arranged on a surface of one side of the lamp body 20, and a plurality of groups of LED pixel lamps 24 arranged in an array on a surface of the other side of the lamp body 20. As showed in FIG. 7, each group of LED pixel lamps 24 is electrically connected with the pins 23, not with all of the pins 23 of course, but with some of the pins 23. Further, since the LED pixel lamps 24 herein are LED light emitting chips which need to be electrically connected with the lamp body 20 through extremely thin Au wires, and that's why a periphery of the LED pixel lamps 24 is wrapped with transparent package (not showed in the drawing) to provide protection and at the same time make sure light emitted from the LED pixel lamps 24 can be transmitted normally.

In a preferred technical solution, the LED pixel lamp 24 comprises LED light emitting chips in red, green and blue, at least one for each of the three colors, anodes of each row of the LED light emitting chips in the same color being connected to one same pin 23, i.e. sharing one pin 23, and cathodes of each column of the LED light emitting chips in the same color being connected to one same pin 23 to share one pin 23 as well. Such a solution remarkably cuts down the number of the pins 23, and power consumption is reduced as the LED light emitting chips in different colors are able to get power supply separately.

In another more preferred technical solution, the LED pixel lamp 24 comprises LED lamps in red, green and blue, at least one for each of the three colors, anodes of each row of the red LED lamps sharing one pin 23, anodes of each row of the green and blue LED lamps sharing another pin 23, and cathodes of each column of the LED lamps sharing one pin 23. In respect that the green and blue LED light emitting chips have almost the same driving voltage, this solution further reduces the number of pins 23 while ensuring low power consumption.

This modularized design, wherein the plurality of groups of LED pixel lamps 24 are arranged in the array on the surface of the one side of the lamp body 20 and correspondingly the plurality of pins 23 are arranged on the surface of the other side of the lamp body 20, will help the surface-mounted LED composite lamp with an ultra-small point distance that employs the technical solutions provided in the Embodiment One to get the lamp body 20 of a larger size that is multiple times larger than a traditional surface-mounted LED pixel lamp, and moreover, each module comprises a plurality of groups of LED pixel lamps 24, 16 groups in particular in the Embodiment One, thereby the mounting step getting easier with a higher mounting efficiency as mounting for one time equals mounting 16 traditional surface-mounted LED pixel lamps and the mounting yield rate getting elevated. Furthermore, a group of surface-mounted LED pixel lamps in the prior art requires four pins 11, whereas in the surface-mounted LED composite lamp with an ultra-small point distance of the present embodiment, the lamp body 10 specifically uses an aluminum substrate allowing alignment to align within the lamp body 20 by utilizing the features of dynamic scanning, where the leads of each group of the LED pixel lamps 24 are grouped to get connected during the packing step and are eventually led to the outside of the lamp body 20 via the pins 23, in which way the average number of pins 23 corresponding to each group of LED pixel lamps 24 is substantially reduced. Reduction in the number of pins 23 not only optimizes the structure of the lamp body 20 by avoiding excessive thinness of the pins 23 so as to reduce the mounting difficulty for a higher yield rate, but also avails to align on the LED light board to lay a very good foundation for the LED display screen to accomplish a high refresh rate and high brightness. Thanks to the step of grouping for connection, the number of pins is reduced and the red lamps could use different pins from those for blue and green lamps to get power supply separately, which lowers power consumption and decreases heat. Also, the modularized design expands space for the lamp surface to enhance light emitting area and color mixing performance. In a word, comparing with a surface-mounted LED pixel lamp in the prior art, the surface-mounted LED composite lamp with an ultra-small point distance of the present invention easily achieves an ultra-small point distance, which is usually less than 2 mm, as small as 1.2 or 1.0 mm or less. In contrast, the point distance of the traditional surface-mounted LED pixel lamp is hard to get to less than 2 mm and, even with a point distance of less than 2 mm achieved, such a traditional surface-mounted LED pixel lamp would be difficult to process and the display quality cannot be guaranteed. Using the surface-mounted LED composite lamp with an ultra-small point distance of the present invention not only improves display quality of the high-definition LED display screen but also greatly reduces manufacturing difficulty and costs.

In a preferred solution, a shading fence 21 is provided around each group of the LED pixel lamps 24, inside of which is the light emitting area. The transparent package is filled within the area surrounded by the shading fence 21, and an outer surface thereof constitutes the light emitting area. The shading fence 21 assures a better display effect, and thanks to the shading fence 21, the lamp board no longer needs any veil mounted to increase contrast, which simplifies a manufacturing art and solves the problem in the prior art of poor veil planeness of high density products with a small point distance.

In a more preferred solution, criss-crossing grooves 22 are formed between each shading fence 21. This structure reduces reflection of ambient light on the lamp surface so that the display contrast is further improved.

In a preferred solution, the surface-mounted LED composite lamp with an ultra-small point distance further comprises a direction notch provided at a corner of the surface of the one side of the lamp body arranged with the pins. A higher assurance of consistency in display is given by providing the direction notch 25 on a back thereof instead of a front thereof.

In a more preferred solution, the lamp body 20 is square block shaped, and the pins 23 are arranged on four edges of the surface of the one side of the lamp body 20. The lamp body 20 may be provided in various shapes facilitating seamless joining, though the square block shape is preferred. The pins 23 may be provided at any position on a bottom of the lamp bode 20, generally not exceeding a bottom range, though the preferred position is near the edges of the four sides of the bottom.

In a further more preferred solution, the groups of LED pixel lamps 24 total 16 and are arranged in a 4×4 array; and the pins 23 total 20, 5 of which are arranged on each of the four edges of the surface of the one side of the lamp body 20. For each surface-mounted LED composite lamp with an ultra-small point distance, there would be little effect if each comprises too few LED pixel lamps 24, like 2×2 groups or 2×3 groups; and such problems as over complicated internal alignment and excessive denseness of pins 23 would occur if each comprises too many LED pixel lamps 24, like 10×10 groups. It is decided that the 4×4 array is reasonable by repeated optimization. For sure, any modularized surface-mounted LED composite lamp with an ultra-small point distance that employs at least 2 groups of the LED pixel lamps 24 shall be covered under the protection scope of the present invention, including without limitation 1×2 groups, 2×2 groups, 2×3 groups, 3×3 groups, 3×4 groups, 3×5 groups, 3×6 groups, 4×5 groups, 4×6 groups, and 6×6 groups.

In a preferred solution, a front face of the lamp body 20 (a surface of the front face of the surface-mounted LED composite lamp with an ultra-small point distance that can be seen includes a surface of the shading fence 21 which is now considered part of the lamp body 20) is matte. Or, both of the front and side faces of the lamp body 20 (including a top, outer and inner side faces of the shading fence 21) are matte. Being matte means that these surfaces have fine structures, which are usually black, either because the material is black or because of after painting, as long as the surface has good light absorption to reduce reflection.

Embodiment Two

Figure 8:
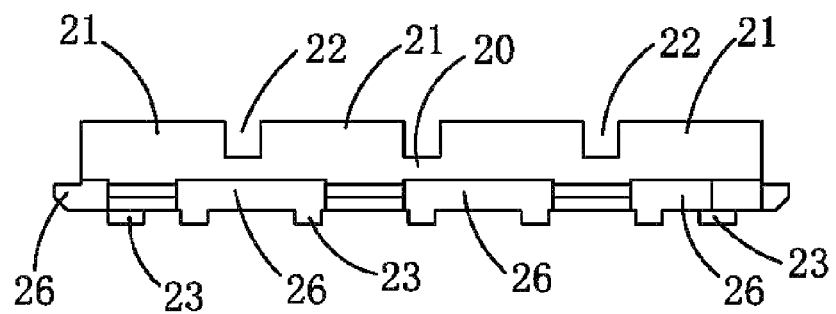
FIG. 8 is a bottom view of the surface-mounted LED composite lamp with an ultra-small point distance in Embodiment Two of the present invention.
Figure 9:
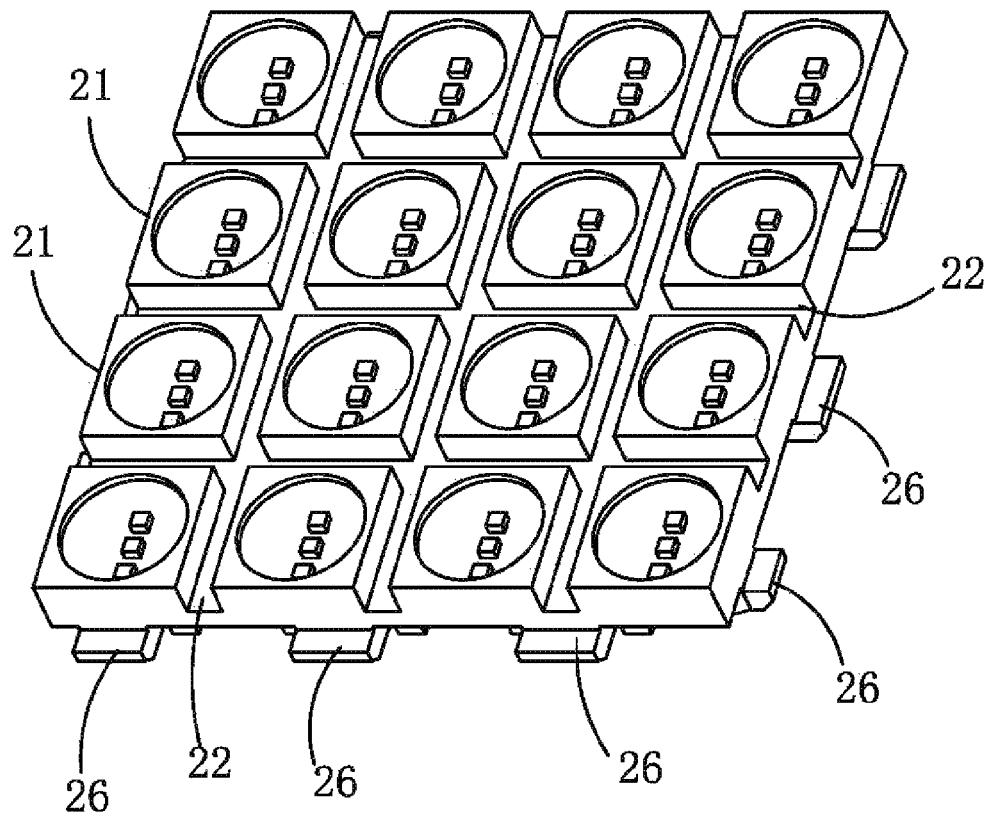
FIG. 9 is a perspective view of the surface-mounted LED composite lamp with an ultra-small point distance in the Embodiment Two of the present invention.
Figure 10:
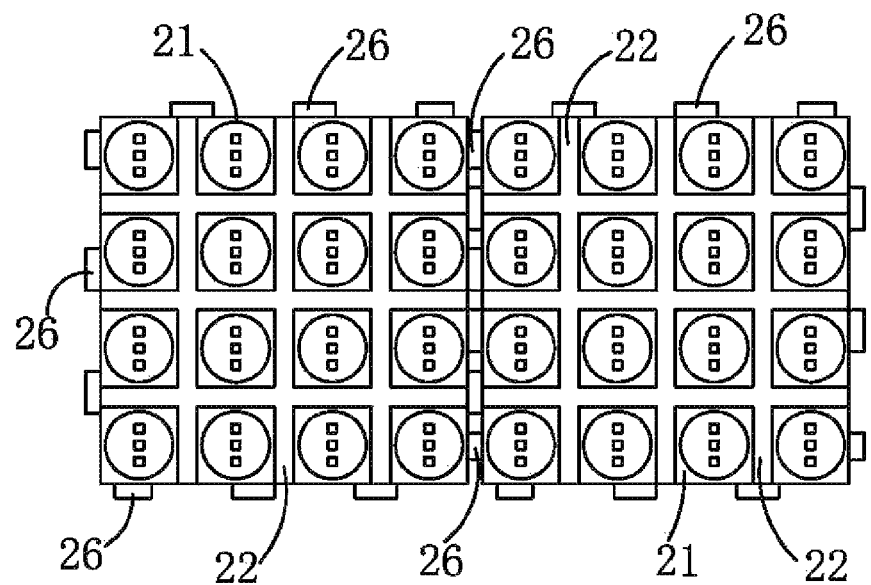
FIG. 10 is a sketch view of the two surface-mounted LED composite lamps with an ultra-small point distance which are joined together in the Embodiment Two of the present invention.

The Embodiment Two provides a surface-mounted LED composite lamp with an ultra-small point distance in a structure showed by FIGS. 8 and 9, which differs from Embodiment One in that at least two opposite sides (as for the Embodiment Two, four sides) of the lamp body 20 of the surface-mounted LED composite lamp with an ultra-small point distance are provided with a plurality of intersecting projections 26. Such a structure is to address a problem of subtle difference in display of joined light boards caused by existence of a gap approximately as wide as the groove 22 between two adjacent surface-mounted LED composite lamps with an ultra-small point distance when a plurality of the LED composite lamps are joined together, which, unlike the groove, runs through the lamp body 20. As showed in FIG. 10, in virtue of the intersecting projections 26 provided at the sides of the lamp body 20, at least a major part of the gap is filled in by the projections 26 after joining so that the gap between two adjacent lamp bodies 20 gets closer to the groove 22 to achieve a smaller display difference and resultantly a better display effect.

In addition, the shading fence 21 of the Embodiment One is a square fence having the four corners chamfered to round corners, whereas the shading fence 21 of the Embodiment Two is externally square but internally circular. In actual use, the square fence has a larger light emitting area with better effect, so a preferred mode for the shading fence 21 is both externally and internally square.

The foregoing is only a description of the present invention in combination with preferred embodiments, and the modes for implementation of this invention are not limited thereby in any way. Any simple derivation or replacement that may be made by those of ordinary skill in the art without departing from the spirit of the invention is covered under the protection scope claimed therein.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A surface-mounted LED composite lamp with an ultra-small point distance, comprising a lamp body, a plurality of pins arranged on a surface of one side of the lamp body, and a plurality of groups of LED pixel lamps arranged in an array on a surface of the other side of the lamp body, a periphery of the LED pixel lamps being wrapped with transparent packages, each group of LED pixel lamps being electrically connected with the pins.

2. The surface-mounted LED composite lamp with an ultra-small point distance according to claim 1, wherein the LED pixel lamp comprises LED light emitting chips in red, green and blue, at least one for each of the three colors, anodes of each row of the LED light emitting chips in the same color being connected to one same pin and cathodes of each column of the LED light emitting chips in the same color being connected to one same pin.

3. The surface-mounted LED composite lamp with an ultra-small point distance according to claim 2, wherein a shading fence is provided around each group of the LED pixel lamps.

4. The surface-mounted LED composite lamp with an ultra-small point distance according to claim 3, wherein criss-crossing grooves are formed between each shading fence.

5. The surface-mounted LED composite lamp with an ultra-small point distance according to claim 2, further comprising a direction notch provided at a corner of the surface of the one side of the lamp body arranged with the pins.

6. The surface-mounted LED composite lamp with an ultra-small point distance according to claim 2, wherein the lamp body is square block shaped, and the pins are arranged on four edges of the surface of the one side of the lamp body.

7. The surface-mounted LED composite lamp with an ultra-small point distance according to claim 6, wherein the groups of LED pixel lamps total 16 and are arranged in a 4×4 array; and the pins total 20, 5 of which are arranged on each of the four edges of the surface of the one side of the lamp body.

8. The surface-mounted LED composite lamp with an ultra-small point distance according to claim 2, wherein at least two opposite sides of the lamp body are provided with intersecting projections.

9. The surface-mounted LED composite lamp with an ultra-small point distance according to claim 1, wherein the LED pixel lamp comprises LED light emitting chips in red, green and blue, at least one for each of the three colors, anodes of each row of the red LED light emitting chips being connected to one same pin, anodes of each row of the green and blue LED light emitting chips being connected to one same pin, and cathodes of each column of the LED light emitting chips in the same color sharing one same pin.

10. The surface-mounted LED composite lamp with an ultra-small point distance according to claim 9, wherein a shading fence is provided around each group of the LED pixel lamps.

11. The surface-mounted LED composite lamp with an ultra-small point distance according to claim 10, wherein criss-crossing grooves are formed between each shading fence.

12. The surface-mounted LED composite lamp with an ultra-small point distance according to claim 9, further comprising a direction notch provided at a corner of the surface of the one side of the lamp body arranged with the pins.

13. The surface-mounted LED composite lamp with an ultra-small point distance according to claim 9, wherein the lamp body is square block shaped, and the pins are arranged on four edges of the surface of the one side of the lamp body.

14. The surface-mounted LED composite lamp with an ultra-small point distance according to claim 13, wherein the groups of LED pixel lamps total 16 and are arranged in a 4×4 array; and the pins total 20, 5 of which are arranged on each of the four edges of the surface of the one side of the lamp body.

15. The surface-mounted LED composite lamp with an ultra-small point distance according to claim 9, wherein at least two opposite sides of the lamp body are provided with intersecting projections.

16. The surface-mounted LED composite lamp with an ultra-small point distance according to claim 1, further comprising a direction notch provided at a corner of the surface of the one side of the lamp body arranged with the pins.

17. The surface-mounted LED composite lamp with an ultra-small point distance according to claim 1, wherein the lamp body is square block shaped, and the pins are arranged on four edges of the surface of the one side of the lamp body.

18. The surface-mounted LED composite lamp with an ultra-small point distance according to claim 17, wherein the groups of LED pixel lamps total 16 and are arranged in a 4×4 array; and the pins total 20, 5 of which are arranged on each of the four edges of the surface of the one side of the lamp body.

19. The surface-mounted LED composite lamp with an ultra-small point distance according to claim 1, wherein at least two opposite sides of the lamp body are provided with intersecting projections.

20. A high-definition LED display screen, comprising a plurality of surface-mounted LED composite lamps with an ultra-small point distance according to claim 1.

* * * * *